May 19, 1936. J. MASSOLLE ET AL Re. 19,974

ELECTRON TUBE

Original Filed April 4, 1921

INVENTORS
JOSEPH MASSOLLE
HANS VOGT
JOSEF ENGL
BY Ward, Crosby & Neal
ATTORNEYS

Reissued May 19, 1936

Re. 19,974

UNITED STATES PATENT OFFICE 19,974

ELECTRON TUBE

Joseph Massolle, Gros-Glienicke, near Cladow, Berlin, Hans Vogt, Berlin-Dahlem, and Josef Engl, Berlin-Schmargendorf, Germany, assignors, by mesne assignments, to American Tri-Ergon Corporation, New York, N. Y., a corporation of New York Original No. 1,587,786, dated June 8, 1926, Serial No. 458,635, April 4, 1921. Application for reissue April 16, 1934, Serial No. 720,870. In Germany December 2, 1919

14 Claims. (Cl. 250—27)

The invention relates to electron tubes, particularly to thermionic amplifying tubes. The invention aims to improve the effectiveness in operation of amplifier tubes, by overcoming an effect, or action, in the operation of amplifiers of common type, which tends to reduce the amplifications secured thereby. In the operation of the well-known amplifier having an effective resistance in series with the plate-filament path of the tube, across the constant source of potential (B battery) of the tube, variation of input voltage causes a variation in the plate-filament potential difference. With grid potential increasing from negative to less negative the plate current will increase and the potential difference between plate and filament decreases. The operating conditions of the tube now correspond to a different current-voltage curve; and a comparison of curves plotted for different potentials at the plate will demonstrate that the amplification indicated by the second curve may be less than that indicated by the first curve.

The effectiveness of the tube will, of course, be improved if a characteristic curve of desirable steepness be selected, and if such arrangements be provided that the operation will remain substantially on the same curve, regardless of varying potential differences between plate and filament. The present invention provides means for accomplishing this object, or, generally speaking, for reducing the effect of variations in the plate potential in varying the amplification factor of the tube. This is accomplished by the provision of an auxiliary anode, or anode screening member, preferably positioned between the plate or working anode and the grid, and connected to the constant potential source of the tube, preferably in such manner that the potential difference between this screening member and the filament is greater than that between the plate or working anode of the tube, and the filament.

In order that the invention may be more clearly understood, attention is hereby called to the accompanying drawing, in which:—

Figure 1:
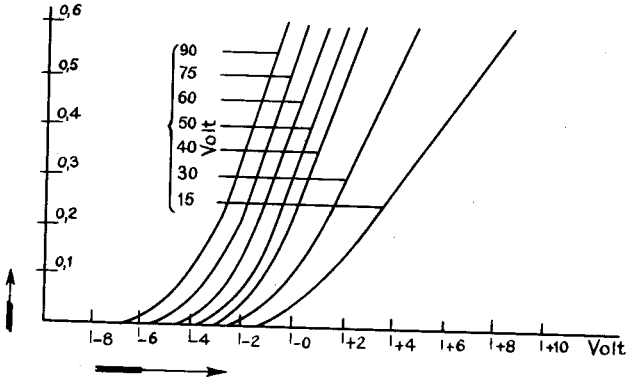
Figure 2:
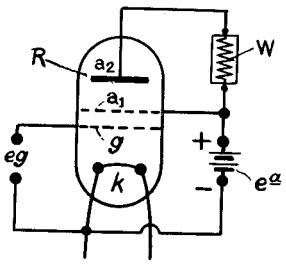
Figure 3:
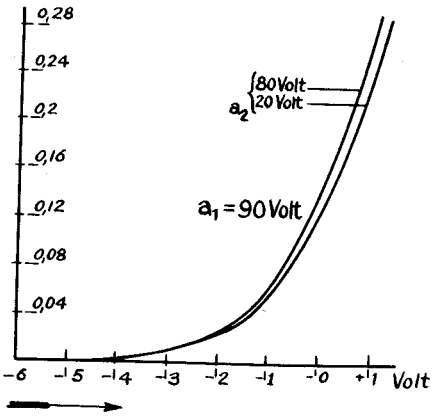

Figure 1 is a diagram giving a series of characteristic curves for a usual type of amplifying tube, indicating the relations between grid potentials and plate current for varying plate potentials, the horizontal coordinate of the diagram indicating grid voltages and the vertical coordinate indicating plate current in milli-amperes, while the numerals at the left hand side of the curves indicate the plate potentials of the various curves, in volts;

Fig. 2 is a view of an electron discharge tube having an anode screening member, or auxiliary anode, in accordance with the present invention; and Fig. 3 is a diagram of current voltage curves for the construction shown in Fig. 2, the horizontal co-ordinate indicating grid voltages, and the vertical co-ordinate indicating plate current in milliamperes.

The curves shown in Figure 1 represent by way of example the relations between grid potentials and plate current for varying plate potentials, recorded with ordinary amplifier tubes, the right hand curve corresponding to 15 volts plate potential and the curves to the left thereof successively 30, 40, 50, 60, 75 and 90 volts. Below 40 volts, in this example, the curves become less steep. It will be noted from the figure that at zero grid voltage, for example, a plate current of about 0.1 milliampere, is indicated at 30 volts plate potential, while at 40 volts plate potential the plate current is about 0.25 milli-amperes.

It may be stated that one of the factors determining the plate current is the influence of the plate acting through the openings of the grid, which may be considered as the passage of lines of force from the plate through the grid. The characteristic curve described will be moved to the left, into the range of negative grid potentials, as the passage of lines of force through the grid increases. This effect occurs if the plate potential be kept constant and the meshes of the grid are increased in size, or if the meshes are kept the same size and the potential at the plate is increased. Conversely, of course, the characteristic is shifted to the right proportionately as the potential at the plate decreases.

To obtain high amplification it is desirable to operate within the range of negative potentials at the grid, as is well-known, a sufficiently negative grid meaning a high resistance between filament and grid and a relatively high plate current. To attain this, the plate voltage must be sufficiently high. In the example shown in Figure 1 the curves have maximum steepness at plate voltages of 40 volts and upwards. It is, therefore, desirable to operate on curves of 40 volts plate potential and upwards.

It will be noted that in the operation of three electrode amplifying tubes of usual construction the working resistance outside the tube is connected in series with the plate-filament path of the tube and with the constant source (B-battery). If now, we assume, for example, that the grid potential becomes less negative momentarily because of changing conditions in the input circuit of the tube, the internal resistance of the tube between plate and filament then decreases and the plate circuit current increases. The drop of potential across the external resistance increases and the potential drop within the tube between plate and filament decreases. That is to say, the electrical conditions within the tube no longer correspond to the current-voltage curve which represented them before the change in input potential, but to another current-voltage curve situated further to the right in a diagram such as that of Figure 1, in which case the amplification may not be so good.

In the construction shown in Fig. 2 illustrating the present invention, the input circuit is connected across the grid $g$ and the filament $k$ as usual, variations in the input circuit causing a varying difference of potential $eg$ across the grid and filament. The plate $a^2$ is shown as connected to the filament by an external connection which includes the resistance $w$ and the source of steady plate current indicated as the battery $ea$.

The anode screening member $a'$ is shown as connected to the positive pole of battery $ea$. Resistance $w$ is included in the connection between plate $a^2$ and the positive pole of the battery, whereas this resistance is not included in the connection between the anode screen, or auxiliary plate, $a'$ and the positive pole of the battery. Accordingly, this arrangement provides for a greater drop of potential between the anode screen $a'$ and the filament, than exists between plate $a^2$ and the filament because of the drop of the potential through resistance $w$. The outgoing circuit may be considered as connected across the terminals of resistance $w$.

In the arrangement shown, which is preferred, the anode screen $a'$ is located between grid $g$ and plate $a^2$. The potential supplied to anode screen $a'$ by the battery or source $ea$ is as nearly constant as possible. The effect of this screening or protecting electrode $a'$ is to greatly decrease the electrostatic lines of force from the working anode or plate $a^2$ through the openings of the grid. By decreasing this flux through the grid to a minimum variation in the voltage of the plate will have practically no effect in displacing the characteristic anode current curve, and, accordingly, good amplification may be obtained, with plate voltage varying within considerable limits, the electrical characteristics of the tube being so chosen that a desirably positioned and sufficiently steep curve is made use of. Instead of having the member $a'$ interposed between the working plate and filament, it is possible to have members $a'$ and $a^2$ arranged one beside the other, the arrangement shown, however, being preferred.

In the example shown, the varying voltage of plate $a^2$ has practically no influence on the range or position of the current-voltage curve of the tube. This is demonstrated by the curves shown in Fig. 4 which were obtained with a tube constructed according to the invention. A constant potential of 90 volts was applied to the anode screen or auxiliary anode $a'$ while voltages of 20 volts and 80 volts respectively were applied to the working anode or plate $a^2$. It will be noted that both curves start from the same point on the horizontal co-ordinate and separate from each other very slightly in the course of the upward rise of the curves, showing that the varying voltage of the plate, in this arrangement, exerts very little influence on the position of the curve.

The screening member $a'$ is preferably grid-like or perforated in form. When this member has small meshes or openings therethrough and there is a relatively large distance between members $a'$ and $a^2$, a proportionately small number of electrons from the heated filament $k$ will pass through the member $a'$ and reach plate $a^2$. If, however, the meshes or the width of the openings in anode screen $a'$ are increased, or if the distance between members $a'$ and $a^2$ is reduced, the number of electrons passing through member $a'$ to the plate $a^2$ becomes relatively greater. As an extreme example, the anode screen $a'$ may be reduced to consist of a single wire only, in which case its surface becomes very small in comparison with that of plate $a^2$, and in that case a considerable part of the electrons emitted by the cathode will pass to plate $a^2$.

It will be noted that as shown in the example in Fig. 2, the full potential of battery $ea$ is applied constantly to the anode screen $a'$, while the potential at plate $a^2$ is reduced by the amount of the potential drop across the resistance $w$. The potential of battery $ea$ may be divided, by means of a potentiometer or otherwise as desired to produce other relations than those shown between the potentials at members $a'$ and $a^2$, the only essential requirement, for best operation, being the fulfillment of the condition that the potential on plate $a^2$ must be less than that on the anode screen $a'$.

We claim:—

1. In electron discharge tubes, the combination of a vacuous tube having plate, grid and filament, and anode screening means located between said plate and filament and having openings through which the plate current passes, an input circuit connected to the grid and filament, a source of potential, and connections therefrom to the plate, filament and screening means, including greater resistance between said source and plate than between said source and screening means, so as to impose a greater potential difference between said screening means and filament than between said plate and filament, said tube having a positive effective internal resistance between plate and filament.

2. In electron discharge tubes, the combination of a vacuous tube having plate, grid and filament, and anode screening means interposed between the plate and grid and having openings through which the plate current passes, output terminals connected to said plate and filament, an input circuit connected to the grid and filament, a source of potential, and connections therefrom to said output terminals and screening means, including an impedance in the connection from the positive terminal of said source of potential to the output terminal of said plate, so as to impose a greater potential difference between said screening means and filament than between said plate and filament, said tube having a positive effective internal resistance between plate and filament.

3. In electron discharge tubes, the combination of a vacuous tube having anode, cathode and control electrode, and anode screening means located between said anode and cathode and having openings through which the plate current passes, means for impressing a varying potential across the cathode and control electrode, a source of steady potential connected between the anode and cathode, a connection between the positive side of said source and said anode screening means, and means interposed between said source and anode for reducing the potential difference between the anode and cathode due to said source to a value below the potential difference between said anode screening means and said cathode, said tube having a positive effective internal resistance between anode and cathode.

4. In electron discharge tubes, the combination of a vacuous tube having anode, cathode and control electrode, and anode screening means, means for impressing a varying potential across the cathode and control electrode, said anode screening means being interposed between said anode and control electrode and having openings through which the plate current passes, connections external to the tube between the anode and cathode, and means for imposing a potential difference between said anode and cathode and a steady potential difference between said anode screening means and said cathode greater than that between said anode and cathode, said tube having a positive effective internal resistance between anode and cathode.

5. In electron discharge tubes, the combination of a vacuous tube having anode, cathode and control electrode, and anode screening means located between said anode and cathode and having openings through which the plate current passes, means for impressing a varying potential across the cathode and control electrode, external means for producing a steady potential, and connections therefrom to said anode, cathode and screening means so as to impose a greater potential difference between said screening means and cathode, than between said anode and cathode, said connections including an impedance providing for a drop of potential between said potential producing means and said anode, said tube having a positive effective internal resistance between anode and cathode.

6. In electron discharge tubes, the combination of a vacuous tube having anode, cathode and control electrode, and anode screening means, means for impressing a varying potential across the cathode and control electrode, said anode screening means being interposed between said anode and control electrode and having openings through which the plate current passes, connections external to the tube betwen the anode and cathode, a source of voltage for imposing a potential difference between said anode and cathode and a steady potential difference between said anode screening means and said cathode greater than that between said anode and cathode, said tube having a positive effective internal resistance between anode and cathode.

7. In electron discharge tubes, the combination of a vacuous tube having anode, cathode and control electrode, and anode screening means, means for impressing a varying potential across the cathode and control electrode, said anode screening means being interposed between said anode and control electrode and having openings through which the plate current passes, connections external to the tube between the anode and cathode, and a source of voltage for imposing a potential difference between said anode and cathode and a steady potential difference between said anode screening means and said cathode greater than that between said anode and cathode, said source of voltage being connected in series with the cathode-anode screening means path of said tube, said connections including a conductor for connecting said source of voltage as an entirety in series with the cathode-anode path of said tube, said tube having a positive effective internal resistance between anode and cathode.

8. In electron discharge tubes, the combination of a vacuous tube having anode, cathode and control electrode, and anode screening means, means for impressing a varying potential across the cathode and control electrode, said anode screening means being interposed between said anode and control electrode and having openings through which the plate current passes, connections external to the tube between the anode and cathode, a source of voltage for imposing a potential difference between said anode and cathode and a steady potential difference between said anode screening means and said cathode greater than that between said anode and cathode, a conductor for connecting the positive terminal of said source of voltage to said anode screening means, said connections including a conductor leading from said anode to said positive terminal of said source of voltage, and a resistance included in the circuit of said last-named conductor, said tube having a positive effective internal resistance between anode and cathode.

9. In electron discharge tubes, the combination of a vacuous tube having plate, grid and filament, and anode screening means, said grid being interposed between said plate and filament and said anode screening means being interposed between said grid and plate, said grid and anode screening means having openings through which the plate current passes, an input circuit connected to the grid and filament, a source of potential, having its negative terminal connected to the filament, a resistance connected in series between the plate and the positive terminal of the source, and a connection between said screening means and a point between the positive pole of the source and the resistance, said tube having a positive effective internal resistance between plate and filament.

10. In electron discharge tubes, the combination of a vacuous tube having plate, grid and filament, and anode screening means interposed between said grid and plate and having openings through which the plate current passes, an input circuit connected to the grid and filament, a single source of potential, having its negative terminal connected to the filament, a resistance connected in series between the plate and the positive terminal of the source, and a connection between said screening means and a point between the positive pole of the source and the resistance, said tube having a positive effective internal resistance between plate and filament.

11. In combination: a multi-electrode electron discharge tube having a cathode, a control grid, a screen grid and an anode, means applying positive potentials to the screen grid and anode relative to the cathode, and means maintaining said potential of the anode less positive than that of the screen grid, said tube having a positive effective internal resistance for voltage changes impressed between the control grid and the cathode.

12. In combination: a multi-electrode electron discharge tube having a cathode, a control grid, a screen grid and an anode, means applying positive potentials to the screen grid and anode relative to the cathode, and means including resistive output impedance connected to the anode for maintaining the said potential of the anode less positive than that of the screen grid, said tube having a positive effective internal resistance for voltage changes impressed between the control grid and the cathode.

13. In combination: a multi-electrode electron discharge tube having a cathode, a control grid, a screen grid and an anode; a connection from the cathode to the anode, said connection containing a direct current voltage source joined at its negative terminal to the cathode, and a resistive output impedance having a terminal joined to the anode; and a connection from the screen grid to a point on the cathode-to-anode connection such as to maintain the screen grid at a more positive potential than the anode, relative to the cathode.

14. In combination: a multi-electrode electron discharge tube having a cathode, a control grid, a screen grid and an anode, a connection from the cathode to the screen grid, said connection containing a direct current voltage source for applying a positive potential to the screen grid relative to the cathode, a connection from the screen grid to the anode, said connection containing a resistive output impedance.

JOSEPH MASSOLLE.
HANS VOGT.
JOSEF ENGL.